(12) United States Patent
Okugawa et al.

(10) Patent No.: US 9,743,195 B2
(45) Date of Patent: Aug. 22, 2017

(54) ACOUSTIC SENSOR

(71) Applicant: OMRON Corporation, Kyoto (JP)

(72) Inventors: Akihiro Okugawa, Moriyama (JP); Takashi Kasai, Kusatsu (JP); Koji Momotani, Nagaokakyo (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 15/011,655

(22) Filed: Jan. 31, 2016

(65) Prior Publication Data

US 2016/0227330 A1    Aug. 4, 2016

(30) Foreign Application Priority Data

Feb. 2, 2015    (JP) ................. 2015-018774

(51) Int. Cl.
*H04R 19/00*    (2006.01)
*H04R 19/04*    (2006.01)
*H04R 31/00*    (2006.01)

(52) U.S. Cl.
CPC .... *H04R 19/005* (2013.01); *B81B 2201/0257* (2013.01); *H04R 19/04* (2013.01); *H04R 31/006* (2013.01); *H04R 2410/03* (2013.01)

(58) Field of Classification Search
CPC . H04R 1/08; H04R 9/08; H04R 11/04; H04R 17/02; H04R 21/02; H04R 19/04; H04R 19/005
USPC .................. 381/170, 174–175, 178
See application file for complete search history.

(56) References Cited

U.S. PATENT DOCUMENTS

| | | | | |
|---|---|---|---|---|
| 8,039,911 | B2 * | 10/2011 | Nakatani | ................. B81B 3/007 |
| | | | | 381/174 |
| 2009/0309171 | A1 | 12/2009 | Schrank | |
| 2013/0016859 | A1 | 1/2013 | Buck | |
| 2013/0294622 | A1 * | 11/2013 | Kasai | ................... H04R 19/005 |
| | | | | 381/162 |

FOREIGN PATENT DOCUMENTS

| | | |
|---|---|---|
| JP | 2007-228352 | 9/2007 |
| JP | 2007-243768 | 9/2007 |
| JP | 2009-523341 | 6/2009 |

* cited by examiner

*Primary Examiner* — Suhan Ni
(74) *Attorney, Agent, or Firm* — Jianq Chyun IP Office

(57) ABSTRACT

An acoustic sensor adapted to convert acoustic vibration to a change in an electrostatic capacitance to detect the acoustic vibration is provided. The acoustic sensor includes a semiconductor substrate, a back plate including a fixed plate arranged to face a surface of the semiconductor substrate, and a fixed electrode film arranged on the fixed plate, and a vibrating electrode film arranged to face the back plate with a space formed therebetween. The vibrating electrode film includes a plate-like vibrating member that vibrates in response to sound pressure. The vibrating electrode film is fixed to the back plate with a fixing unit thereof including one or more fixing portions each including a fixing protruding end that is arranged on a protruding end of a leg portion protruding from an edge of the vibrating member. The vibrating member has an edge portion surrounding at least a part of the fixing protruding end.

17 Claims, 10 Drawing Sheets

ACOUSTIC SENSOR

CROSS-REFERENCE TO RELATED APPLICATION

This application claims the priority benefit of Japan Application No. 2015-018774, filed on Feb. 2, 2015. The entirety of the above-mentioned patent application is hereby incorporated by reference herein and made a part of this specification.

BACKGROUND OF THE INVENTION

Field

The present application relates to an acoustic sensor.

Background

Electret condenser microphones (ECMs) incorporating acoustic sensors are miniature microphones that have been used conventionally. However, ECMs are weak against heat, and are less suited to digitization and miniaturization than MEMS microphones, which incorporate acoustic sensors fabricated with micro electro mechanical systems (MEMS). Such MEMS microphones are increasingly used nowadays (refer to, for example, Patent Literatures 1 to 4).

One type of acoustic sensor using the MEMS technique includes a back plate to which an electrode film is fixed, and a vibrating electrode film, which vibrates in response to sound waves, arranged to face the back plate with a space formed between them. This acoustic sensor can be fabricated by, for example, forming a vibrating electrode film on a substrate, forming a sacrificial layer over the vibrating electrode film, and forming a back plate on the sacrificial layer, and then removing the sacrificial layer. The MEMS technique, which uses a semiconductor fabrication technique, can produce an extremely small acoustic sensor. However, such an acoustic sensor fabricated with the MEMS technique may typically include a thin vibrating electrode film to detect an extremely low pressure, and a back plate. Unlike other sensors that simply detect pressure, the acoustic sensor provides good acoustic characteristics by placing the vibrating electrode film suspended from the substrate to form a ventilation hole. This vibrating electrode film thus uses a soft support. In this case, the acoustic sensor tends to be less strong, and may not have high resistance to impact. Parts of the vibrating electrode film and the back plate that are structurally likely to receive stress may be reinforced, but such reinforced parts may cause more stress applied to other parts.

PATENT LITERATURE

Patent Literature 1: Japanese Unexamined Patent Application Publication No. 2007-228352

Patent Literature 2: Japanese Unexamined Patent Application Publication No. 2007-243768

Patent Literature 3: Japanese Unexamined Patent Application Publication (Translation of PCT Application) No. 2009-523341

Patent Literature 4: U.S. Patent Application Publication No. 2013-016859

SUMMARY OF THE INVENTION

One or more aspects of the present invention are directed to improving the impact resistance of a vibrating electrode film and a back plate while reducing stress generated in parts of the vibrating electrode film and the back plate.

In response to the above issue, one aspect of the invention provides an acoustic sensor including a vibrating electrode film arranged between a back plate and a semiconductor substrate. The acoustic sensor includes a plate-like vibrating member that vibrates in response to sound pressure. The vibrating member is fixed to the back plate with a fixing unit thereof including a fixing protruding end that is arranged on a protruding end of a leg portion protruding from an edge of the vibrating member. The back plate has an edge portion surrounding at least a part of the fixing protruding end.

In detail, the acoustic sensor includes a back plate including a fixed plate arranged to face a surface of the semiconductor substrate, and a fixed electrode film arranged on the fixed plate, and a vibrating electrode film arranged to face the back plate with a space formed therebetween. The acoustic sensor converts acoustic vibration to a change in an electrostatic capacitance between the vibrating electrode film and the fixed electrode film, and detects the acoustic vibration. The vibrating electrode film includes a plate-like vibrating member configured to vibrate in response to sound pressure. The vibrating electrode film is fixed to the back plate with the fixing unit thereof including one or more fixing portions each including a fixing protruding end that is arranged on a protruding end of a leg portion protruding from an edge of the vibrating member. The back plate has an edge portion surrounding at least a part of the fixing protruding end.

The above acoustic sensor includes the vibrating member fixed to the back plate with the fixing unit including the fixing protruding end that is arranged on the protruding end of the leg portion protruding from the edge of the vibrating member. In this structure, the leg portion reduces residual stress caused by, for example, the coefficient of thermal expansion of the vibrating member fabricated through semiconductor fabrication processes, and thus prevents deformation of the back plate. The portion of the back plate from which the vibrating electrode film is suspended has relatively high rigidity in the back plate, with the edge portion of the back plate surrounding the fixing portion. This portion of the back plate is relatively difficult to deform although the vibrating electrode film is suspended from that portion.

In this acoustic sensor described above, the fixing portion of the vibrating electrode film is arranged on the protruding end of the leg portion, and is fixed to the dead end portion of the back plate, which partially surrounds the fixing portion with a dead end. The leg portion reduces residual stress from the vibrating member, and thus prevents deformation of the back plate. The vibrating electrode film suspended from the back plate can deform in accordance with the deformation of the back plate. Further, stress or distortion is less likely to be transmitted directly from the semiconductor substrate to the vibrating electrode film. This structure thus improves the impact resistance of the vibrating electrode film and the back plate while reducing stress generated in parts of the vibrating electrode film and the back plate.

At least one of the fixing portions included in the fixing unit may include a reinforcing portion at a position thereof opposite to a position where the vibrating electrode film is fixed to the back plate. In this acoustic sensor, the back plate has high rigidity around the at least one fixing portion including the reinforcing portion. This structure reduces warping of the back plate.

Each of all the fixing portions included in the fixing unit may include a reinforcing portion at a position thereof opposite to a position where the vibrating electrode film is fixed to the back plate. In this acoustic sensor, the back plate has a smaller load applied from the fixing portions including the reinforcing portions without concentration of the load on the part of the back plate where the vibrating electrode film is suspended.

At least one of the reinforcing portions may be electrically connected to the vibrating electrode film, and may serve as a terminal of the vibrating electrode film. This acoustic sensor eliminates another terminal electrically connected to the vibrating electrode film separately from the reinforcing portion. This simplifies the structure of the acoustic sensor.

At least one of the fixing portions may include a set of separate fixing portions each having a smaller area. This acoustic sensor reduces stress generated in the fixing portions, as compared with an acoustic sensor including fixing portions that are not separated into a plurality of fixing portions.

The vibrating electrode film may include a plurality of separate areas as viewed from above, and include a plurality of the vibrating members in correspondence with the plurality of separate areas. A least one of the plurality of vibrating members may have a smaller area than other vibrating members, and the at least one of the plurality of vibrating members having a smaller area than the other vibrating members may be fixed to the back plate with at least one fixing portion arranged on an edge thereof. In this acoustic sensor, the vibrating member having a relatively small area and thus having high rigidity is fixed to the back plate having smaller rigidity than the semiconductor substrate. When, for example, the acoustic sensor falls, the vibrating member subjected to compressed air can deform in accordance of the deformation of the back plate and thus reduces stress. In this manner, the vibrating member will receive less stress than when the vibrating member is fixed to the semiconductor substrate having higher rigidity than the back plate.

Another aspect of the present invention provides an acoustic sensor including a back plate including a fixed plate arranged to face a surface of a semiconductor substrate, and a fixed electrode film arranged on the fixed plate, and a vibrating electrode film arranged to face the back plate with a space formed therebetween. The vibrating electrode film includes a plurality of separate areas as viewed from above, and includes a plurality of vibrating members in correspondence with the plurality of separate areas, and the plurality of vibrating members are configured to convert acoustic vibration to a change in an electrostatic capacitance between the vibrating electrode film and the fixed electrode film. At least one of the plurality of vibrating members may have a smaller area than other vibrating members, and the at least one of the plurality of vibrating members having a smaller area than the other vibrating members may be fixed to the back plate with at least one fixing portion arranged on an edge thereof. In this acoustic sensor, the vibrating member having a relatively small area and thus having high rigidity is fixed to the back plate having smaller rigidity than the semiconductor substrate. The vibrating member will receive less stress than when the vibrating member is fixed to the semiconductor substrate having higher rigidity than the back plate.

The acoustic sensor described above improves the impact resistance of the vibrating electrode film and the back plate while reducing stress generated in parts of the vibrating electrode film and the back plate.

DETAILED DESCRIPTION

Embodiments of the present invention will now be described. The embodiments described below are mere examples of the present invention and do not intend to limit the technical scope of the present invention.

Figure 1:
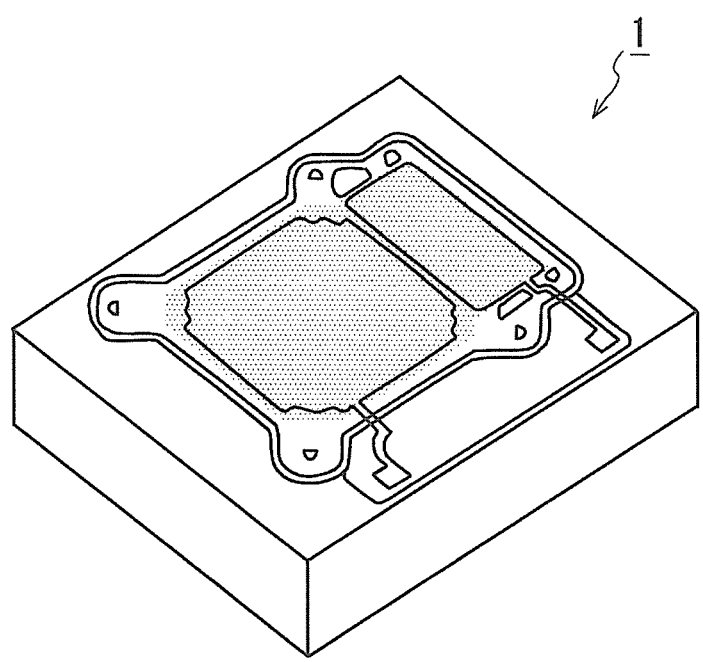
FIG. 1 is a perspective view of an acoustic sensor according to one embodiment.
Figure 2:
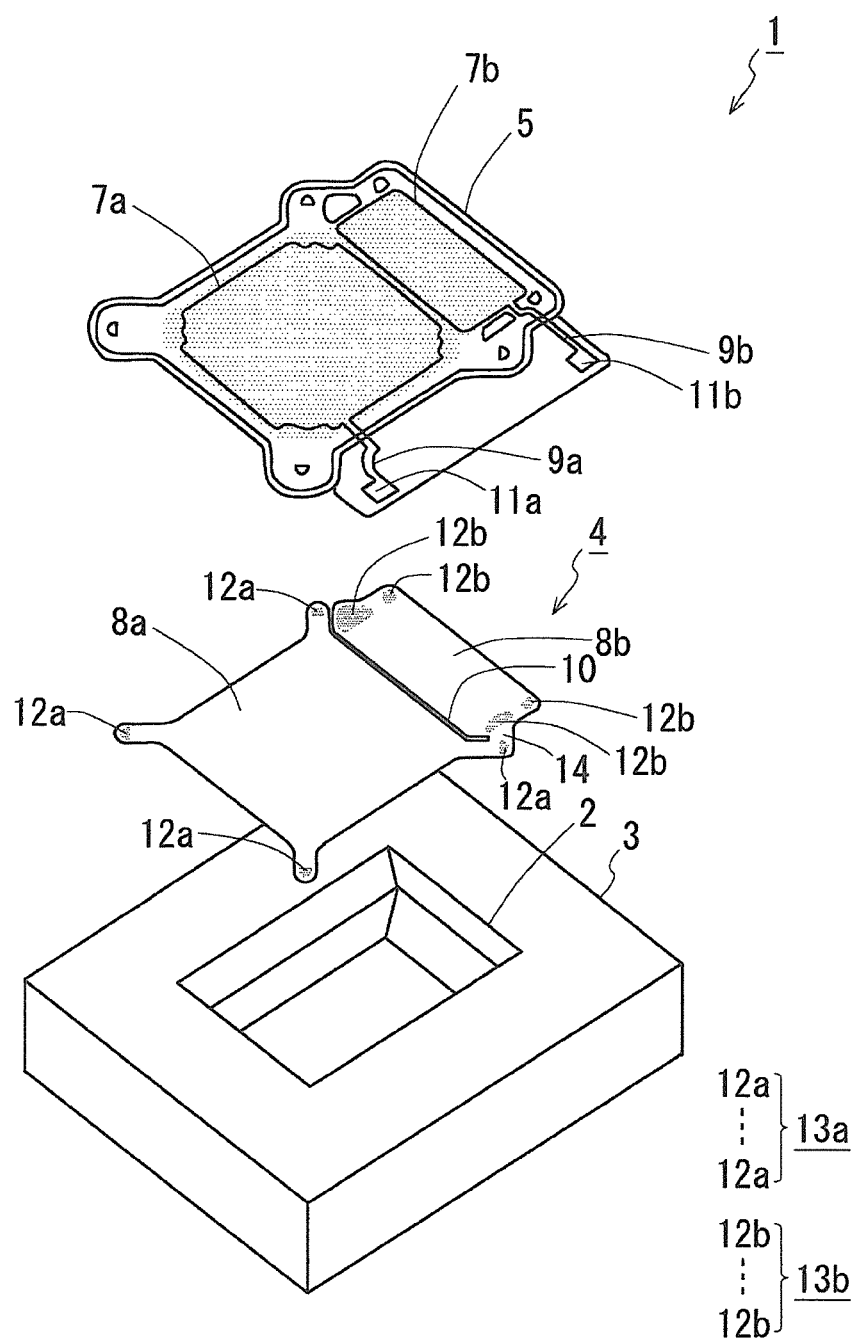
FIG. 2 is an exploded perspective view showing the internal structure of the acoustic sensor according to one embodiment.

FIG. 1 is a perspective view of an acoustic sensor 1 according to one embodiment. FIG. 2 is an exploded perspective view showing the internal structure of the acoustic sensor 1 according to one embodiment. The acoustic sensor 1 is a capacitance acoustic sensor fabricated using the micro electro mechanical systems (MEMS) technique. The acoustic sensor 1 is a laminate of a silicon substrate (semiconductor substrate) 3 having a back chamber 2, and a vibrating electrode film (diaphragm) 4 and a back plate 5 arranged on the substrate 3. The back plate 5 has fixed electrode films 7a and 7b arranged on its surface adjacent to the silicon substrate 3. The vibrating electrode film 4, which is arranged on the surfaces of the fixed electrode films 7a and 7b adjacent to the silicon substrate 3, includes separate vibrating members 8a and 8b. The vibrating member 8a faces the fixed electrode film 7a. The vibrating member 8b faces the fixed electrode film 7b. The vibrating member 8b has a smaller area than the vibrating member 8a.

The back plate 5 has a plurality of acoustic holes (sound holes) located across the entire surface (the dots in the shaded area of the back plate 5 in FIGS. 1 and 2 represent the individual acoustic holes). The fixed electrode films 7a and 7b are electrically connected to their corresponding fixed electrode pads 11a and 11b with lead wires 9a and 9b.

The silicon substrate 3 is formed from, for example, single crystal silicon. The silicon substrate 3 has the back chamber 2, which is a through-hole formed through the substrate to extend from its front surface to the back surface.

The vibrating electrode film 4 is formed from, for example, conductive polysilicon. The vibrating electrode film 4 is a thin film including the substantially square vibrating member 8a and the substantially rectangular vibrating member 8b, which are separated from each other by a slit 10. The vibrating members 8a and 8b include fixing portions 12a and 12b in their corners. The vibrating electrode film 4 is arranged on the surface of the silicon substrate 3 adjacent to the back plate 5 in such a manner that the vibrating members 8a and 8b cover the back chamber 2. The vibrating member 8a is suspended from the back plate 5 and is fixed using a fixing portion set 13a (an example of a fixing unit of the present application) including a plurality of fixing portions 12a. The vibrating member 8b is suspended from the back plate 5 and is fixed using a fixing portion set 13b. The vibrating member 8a and the vibrating member 8b are separated from each other by the slit 10, but are structurally and electrically connected to each other with a contact portion 14, which is arranged in a corner of the vibrating member 8a and a corner of the vibrating member 8b. The fixing portion set 13b includes a plurality of fixing portions 12b each having a small area (an example of separate fixing portions of the present application).

In response to sound pressure, the vibrating members 8a and 8b included in the vibrating electrode film 4 vibrate in the direction of the normal to the vibrating electrode film 4. The vibrating member 8a and the vibrating member 8b have different areas, and thus respond to different sound pressures. For example, the vibrating member 8b having a smaller area than the vibrating member 8a vibrates in the direction of the normal to the vibrating member 8a in response to a larger sound than the vibrating member 8a. The fixed electrode film 7a arranged on the back plate 5 faces a vibrating area of the vibrating member 8a except the fixing portions 12a arranged in the four corners. The fixed electrode film 7b arranged on the back plate 5 also faces a vibrating area of the vibrating member 8b except the fixing portions 12b arranged on the two ends in the longitudinal direction in the same manner as the fixed electrode film 7a. This is because the fixing portions 12a arranged in the four corners of the vibrating member 8a and the fixing portions 12b arranged on the two ends of the vibrating member 8b are fixed, and thus do not vibrate in response to sound pressure and cause no change in the electrostatic capacitance between the vibrating electrode film 4 and the fixed electrode films 7a and 7b.

When sound reaches the acoustic sensor 1, the sound passes through the acoustic holes and applies sound pressure to the vibrating members 8a and 8b of the vibrating electrode film 4. The acoustic holes allow the sound pressure to be applied to the vibrating members 8a and 8b of the vibrating electrode film 4. The acoustic holes further allow air within an air gap between the back plate 5 and the vibrating electrode film 4 to escape outside to reduce thermal noise, and thus reduces signal noise.

In the acoustic sensor 1 with the structure described above, the vibrating electrode film 4 receives sound and vibrates to change the distance between the vibrating members 8a and 8b of the vibrating electrode film 4 and the fixed electrode films 7a and 7b. A change in the distance between the vibrating members 8a and 8b of the vibrating electrode film 4 and the fixed electrode films 7a and 7b is converted into a change in the electrostatic capacitance between the vibrating members 8a and 8b of the vibrating electrode film 4 and the fixed electrode films 7a and 7b. Thus, applying a direct voltage between the vibrating electrode film 4 and the fixed electrode films 7a and 7b generates an electrical signal representing a change in the electrostatic capacitance. In this manner, the sound pressure can be detected as an electrical signal.

Figure 3:
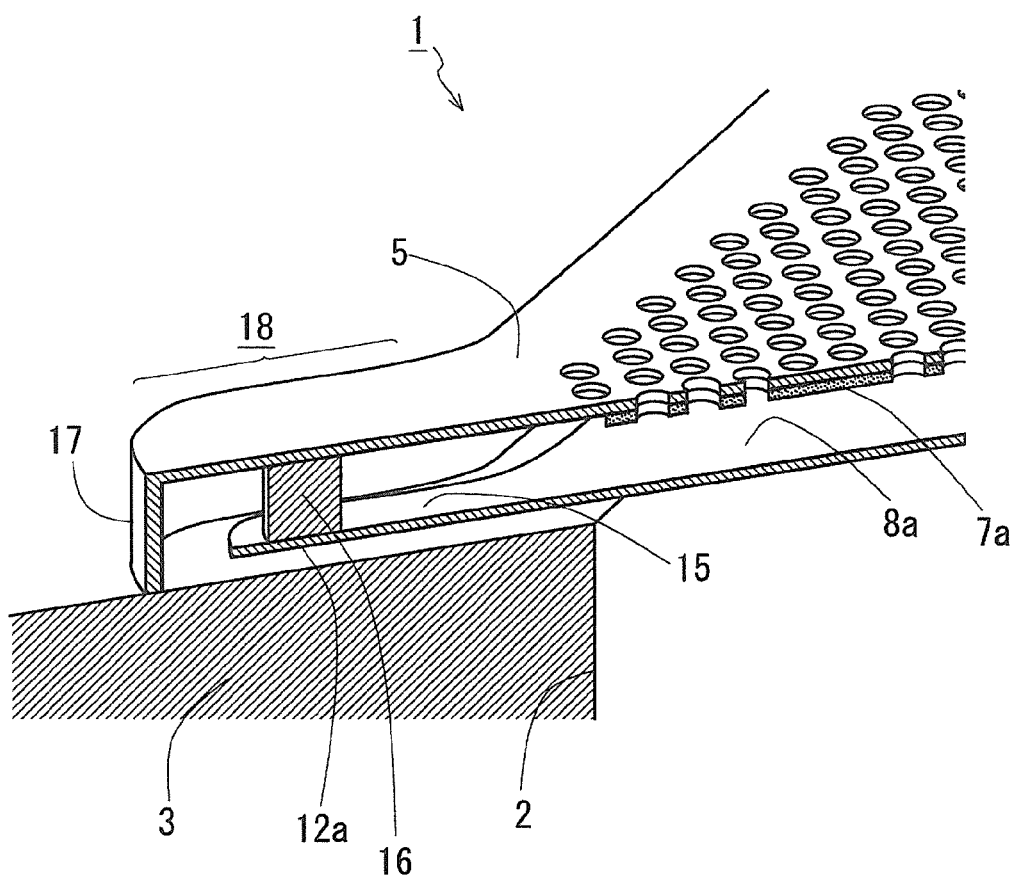
FIG. 3 is an enlarged view showing the internal structure around a fixing portion.

FIG. 3 is an enlarged view showing the internal structure around the fixing portion 12a. As shown in FIG. 3, the fixing portion 12a in each of the four corners of the vibrating electrode film 4 is arranged on a protruding end of a leg portion 15 protruding from the edge of the vibrating member 8a, which vibrates in response to sound pressure. Thus, the fixing portion 12a may also be referred to as a fixing protruding end. Each fixing portion 12a is fixed to the back plate 5 with a spacer 16. The leg portion 15 protrudes from a corner portion of the edge of the rectangular vibrating member 8a as viewed from above. The leg portion 15 is an elongated portion with low rigidity, which extends along the surface of the vibrating member 8a. The leg portion 5 reduces stress acting between the back plate 5 and the vibrating member 8a via the fixing portion 12a. The back plate 5 includes an edge portion 17 surrounding the fixing portion 12a. Thus, the leg portion 15 and the fixing portion 12a are accommodated in a space with a dead end defined by the back plate 5 and the silicon substrate 3. A portion of the back plate 5 surrounding the leg portion 15 and the fixing portion 12a is hereafter referred to as a dead end portion 18.

Figure 4:
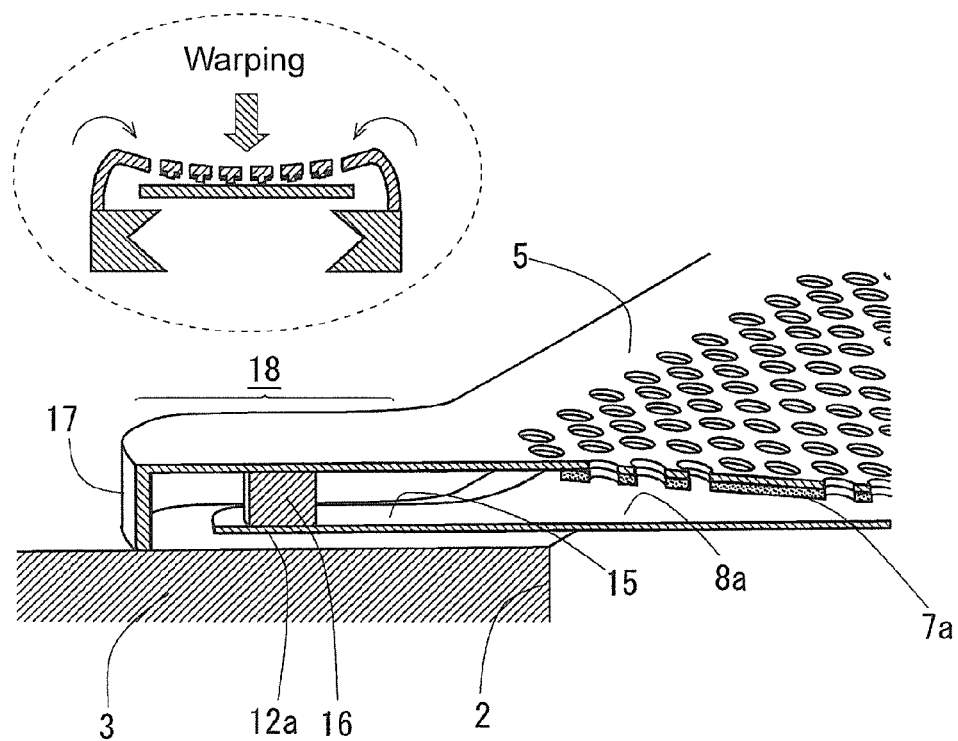
FIG. 4 is an enlarged view showing the internal structure around a fixing portion when a back plate warps.

FIG. 4 is an enlarged view showing the internal structure around the fixing portion 12a when the back plate 5 warps. The back plate 5 may warp under the moment of a force generated due to a difference in coefficient of thermal expansion caused by stress differences or different materials between different parts. The back plate 5 may also warp when affected by deformation of the silicon substrate 3 due to the opening of the back chamber 2. The warped back plate 5 can theoretically affect the vibrating electrode film 4, which is fixed to the back plate 5 via the spacer 16. However, the acoustic sensor 1 according to the present embodiment includes the vibrating member 8a that is fixed to the back plate 5 via the leg portion 15, which protrudes from the corner portion of the edge of the vibrating member 8a. The deformation of the back plate 5 is less likely to be transmitted through the leg portion 15. The portion of the back plate 5 from which the vibrating electrode film 4 is suspended includes the edge portion 17 surrounding the fixing portion 12a. Further, the spacer 16 is arranged on the lower surface of the back plate 5 to allow the vibrating electrode film 4 to be suspended. The portion of the back plate 5 from which the vibrating electrode film 4 is suspended thus has relatively high rigidity in the back plate 5, and is less likely to deform when the entire back plate 5 warps. The acoustic sensor 1 according to the present embodiment includes each fixing portion 12a arranged on the protruding end of the corresponding leg portion 15 and further fixed to the dead end portion 18 of the back plate 5 surrounding the fixing portion 12a. This structure minimizes the degree by which the deformation of the back plate 5 affects the vibrating electrode film 4, and improves the impact resistance of the vibrating electrode film 4 and the back plate 5. The portion of the back plate 5 from which the vibrating electrode film 4 is suspended includes the edge portion 17 surrounding the fixing portion 12a, and thus has relatively high rigidity in the back plate 5. This structure thus reduces warping of the back plate 5 caused by the suspended vibrating electrode film 4.

The acoustic sensor 1 according to the present embodiment further has the advantages described below. The acoustic sensor 1 according to the present embodiment includes the vibrating member 8a fixed to the back plate 5 with the leg portion 15. If, for example, the vibrating member 8a included in the vibrating electrode film 4 contracts and produces residual stress due to a difference in coefficient of thermal expansion during semiconductor fabrication processes, the residual stress applied from the vibrating member 8a to the fixing portion 12a is absorbed by the leg portion 15 having low rigidity. This reduces the residual stress applied from the vibrating member 8a of the vibrating electrode film 4 to the fixing portion 12a, and thus improves the impact resistance of the vibrating electrode film 4 and the back plate 5.

Figure 5:
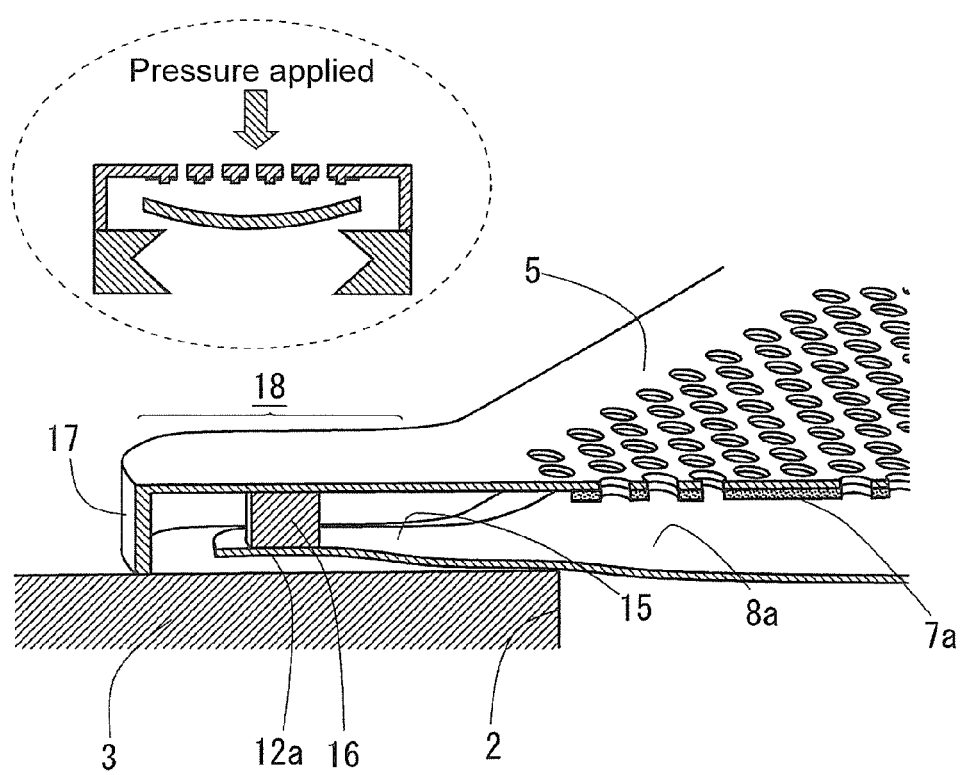
FIG. 5 is an enlarged view showing the internal structure around a fixing portion when a vibrating electrode film receives an extremely high pressure.

FIG. 5 is an enlarged view around the fixing portion 12a when an extremely high pressure is applied to the vibrating electrode film 4. The acoustic sensor 1 according to the present embodiment includes the vibrating electrode film 4 arranged over the silicon substrate 3 in such a manner that the vibrating members 8a and 8b cover the back chamber 2. The fixing portion 12a is fixed to the back plate 5 with the leg portion 15, which protrudes from the corner portion of the edge of the vibrating member 8a. As a result, the fixing portion 12a and the opening rim of the back chamber 2 are spaced from each other by the length of the leg portion 15. When, for example, an extremely large pressure is applied to the vibrating member 8a to press the vibrating member 8a toward the back chamber 2 as shown in FIG. 5, the vibrating member 8a comes in contact with the opening rim of the back chamber 2 to prevent the leg portion 15 from deforming greatly. This reduces concentration of stress onto the leg portion 15 or the fixing portion 12a, where stress concentrates easily, and improves the impact resistance of the vibrating electrode film 4 and the back plate 5.

Figure 6:
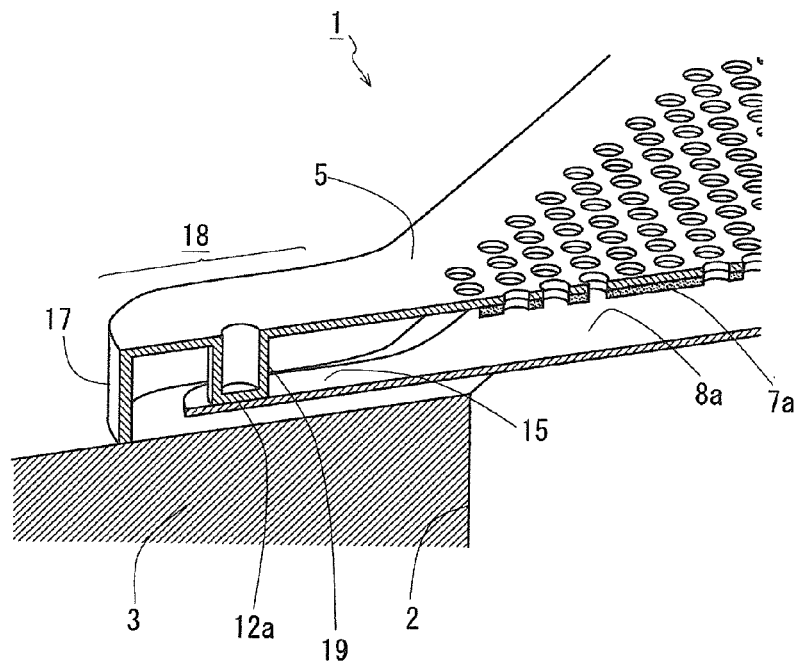
FIG. 6 is a diagram showing the structure around a fixing portion according to a modification.

FIG. 6 is a diagram showing the structure around a fixing portion 12a according to a modification. The acoustic sensor 1 according to the above embodiment may use a portion of the back plate 5 to suspend the vibrating electrode film 4 as shown in FIG. 6, instead of using the spacer 16. The spacer 16 formed from, for example, an oxide silicon film, can have its shape varying depending on the wet etching time. In this case, the spacer 16 may not be shaped uniformly. The back plate 5 formed from, for example, a nitride silicon film, which has a higher corrosion resistance and a higher wear resistance than an oxide silicon film, may include a portion to suspend the vibrating electrode film 4, which can replace the spacer 16. This structure prevents the vibrating electrode film 4 from being fixed using the spacer 16 with an unintended shape.

As the portion of the back plate 5 to suspend the vibrating electrode film 4, the back plate 5 may include, for example, a protrusion 19, which protrudes downward from a lower surface of the back plate 5 facing the corresponding fixing portions 12a and 12b as shown in FIG. 6. This protrusion 19 can replace the spacer 16. The protrusion 19 may be shaped variously, but may be, for example, cylindrical as shown in FIG. 6 for easy formation of a nitride silicon film as the back plate 5, and providing an intended film thickness of the back plate 5 or an intended area of the fixing portions 12a and 12b.

Figure 7:
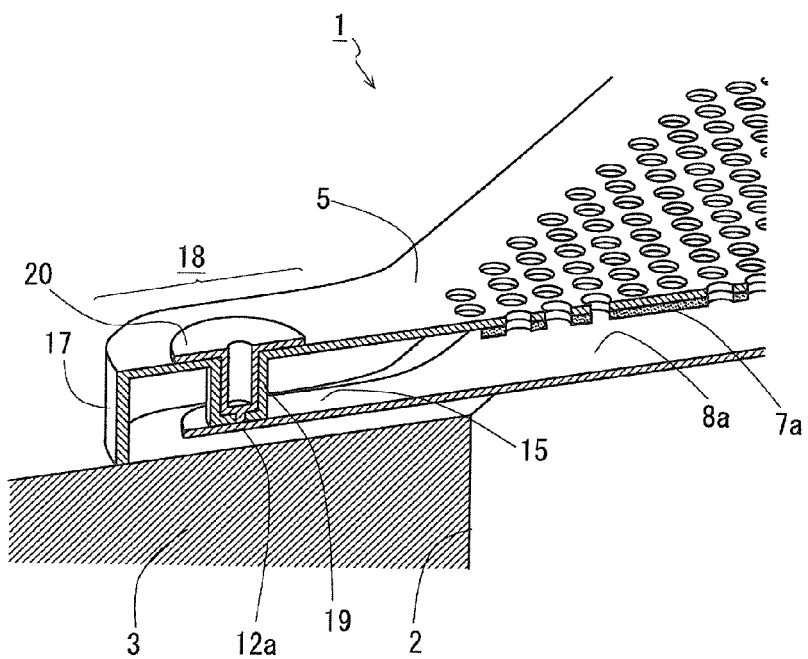
FIG. 7 is a diagram showing the structure around a fixing portion that is reinforced according to a modification.

FIG. 7 is a diagram showing the structure around a fixing portion 12a that is reinforced according to a modification. In the acoustic sensor 1 according to the above embodiment or modifications, as shown in FIG. 7, the fixing portion 12a may include, for example, a reinforcing portion 20, which is formed from a metal film, at a position of the back plate 5 opposite to a position where the vibrating electrode film 4 is fixed. The back plate 5 from which the vibrating electrode film 4 is suspended receives the load from the vibrating electrode film 4 applied via the spacer 16 or the protrusion 19. The reinforcing portion 20, which is formed from a metal film, arranged on an appropriate position of the back plate 5 (on the fixing portion 12a or the fixing portion 12b) will increase the strength of the portion of the back plate 5 from which the vibrating electrode film 4 is suspended. The reinforcing portion 20 may be formed from polysilicon, instead of a metal film.

When the portion to be reinforced by the reinforcing portion 20 includes the cylindrical protrusion 19, the reinforcing portion 20 is formed, for example, both inside and outside the cylindrical protrusion 19 as shown in FIG. 7. Before the reinforcing portion 20 is formed, the protrusion 19 may have a through-hole in its bottom through the upper surface of the back plate 5 and the fixing portion 12a of the vibrating electrode film 4. The reinforcing portion 20, which is formed from a metal film, is electrically connected to the vibrating electrode film 4 through the hole in the bottom of the protrusion 19. In this case, the reinforcing portion 20 can serve as a terminal of the vibrating electrode film 4.

The reinforcing portion 20 may be arranged at any appropriate position, or for example on each fixing portion 12a or each fixing portion 12b. To allow the electrostatic capacitance to change uniformly within the plane of each of the vibrating members 8a and 8b that vibrate in response to sound pressure and to detect sound in an appropriate manner, the reinforcing portions 20 may be arranged symmetric relative to the center of each of the vibrating members 8a and 8b to reduce asymmetric warping of the back plate 5 and the vibrating members 8a and 8b.

Figures 8A, 8B, 8C, 8D:
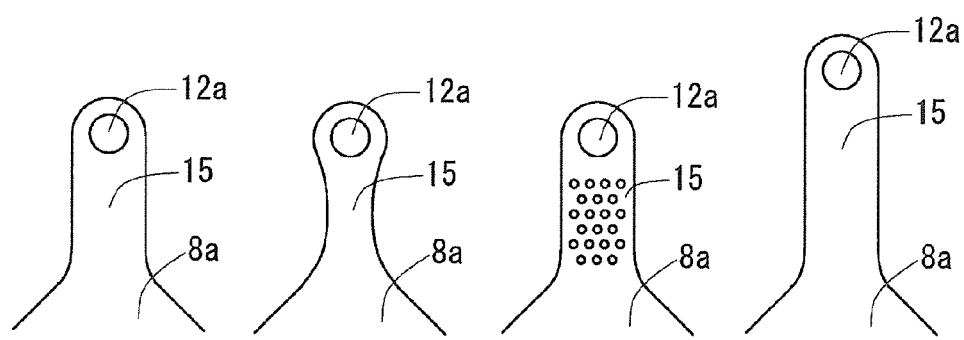
FIGS. 8A to 8D are diagrams showing leg portions according to modifications.

FIGS. 8A to 8D are diagrams showing leg portions 15 according to modifications. These leg portions 15 are used to reduce stress acting between the back plate 5 and the vibrating member 8a via the fixing portion 12a, and thus may be adjusted to have appropriate rigidity. The leg portion 15 shown in FIG. 8A has, for example, a uniform width from the vibrating member 8a to the fixing portion 12a. The leg portion 15 may have a lower rigidity than the structure shown in FIG. 8A by employing the structures described below. For example, the leg portion 15 shown in FIG. 8B has a smaller width from the vibrating member 8a to the fixing portion 12a to lower the rigidity. The leg portion 15 shown in FIG. 8C has a number of holes to lower the rigidity. The leg portion 15 shown in FIG. 8D is long to lower the rigidity.

Although the acoustic sensor 1 according to the above embodiments and modifications includes the two vibrating members 8a and 8b, an acoustic sensor described in the present application may have another structure. For example, an acoustic sensor shown in FIG. 9 includes a vibrating electrode film 4 that is not separated into two by the slit 10. The acoustic sensor 1 according to the above embodiments and modifications may be modified to, for example, the acoustic sensor 1' shown in FIG. 9 including a vibrating electrode film 4', which is not separated into two by a slit.

Figure 9:
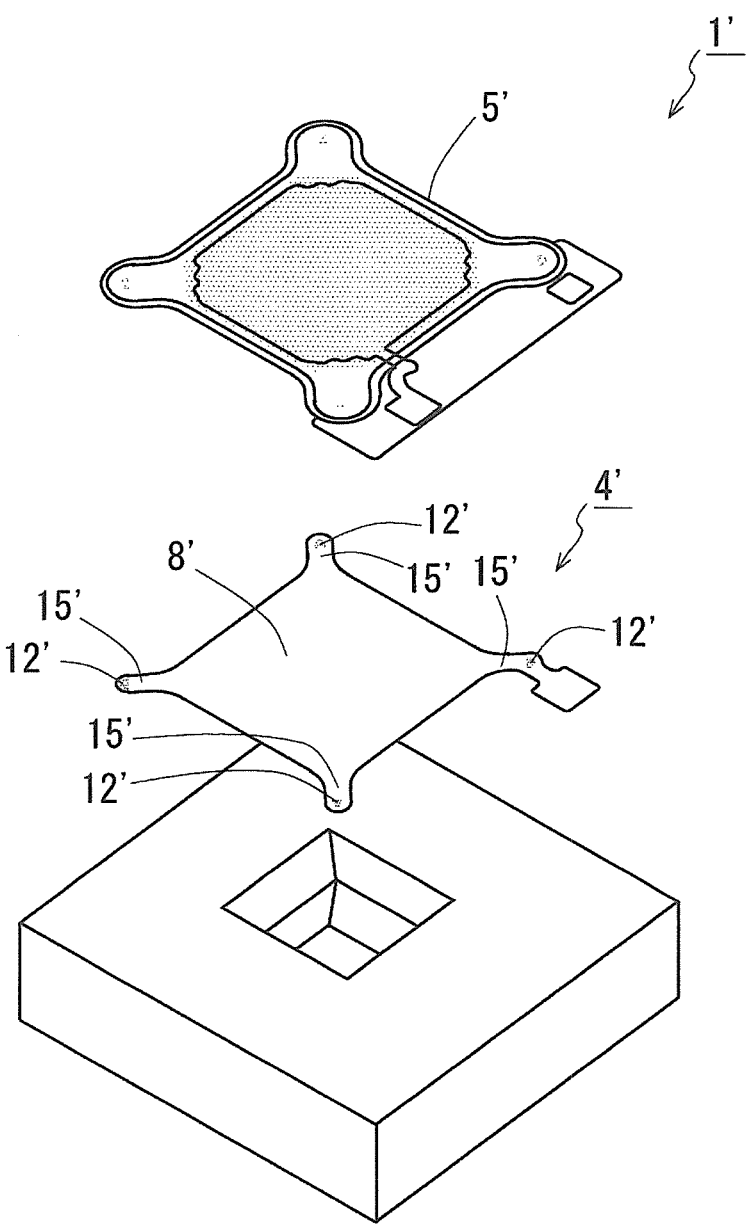
FIG. 9 is a diagram showing an acoustic sensor including a vibrating electrode film that is not separated into two by a slit.

As shown in FIG. 9, the acoustic sensor 1' according to this modification includes the vibrating electrode film 4' including a vibrating member 8' that is substantially square as viewed from above. The vibrating electrode film 4' includes a fixing portion 12' (an example of a fixing protruding end) arranged at a protruding end of each leg portion 15', which protrudes from the corresponding one of the four corner of an edge of the vibrating member 8'. Each fixing portion 12' is fixed to the back plate 5' to allow the vibrating electrode film 4' to be suspended from the back plate 5'. The back plate 5' has an edge portion surrounding each fixing portion 12a'.

The acoustic sensor 1' according to the modification also includes a fixing portion 12' arranged at a protruding end of each leg portion 15', and is fixed to a dead end portion of the back plate 5' surrounding the fixing portion 12' in the same manner as the acoustic sensor 1 according to the above embodiments and modifications. This structure minimizes the degree by which deformation of the back plate 5' affects the vibrating electrode film 4', and improves the impact resistance of the vibrating electrode film 4' and the back plate 5'.

Figure 10:
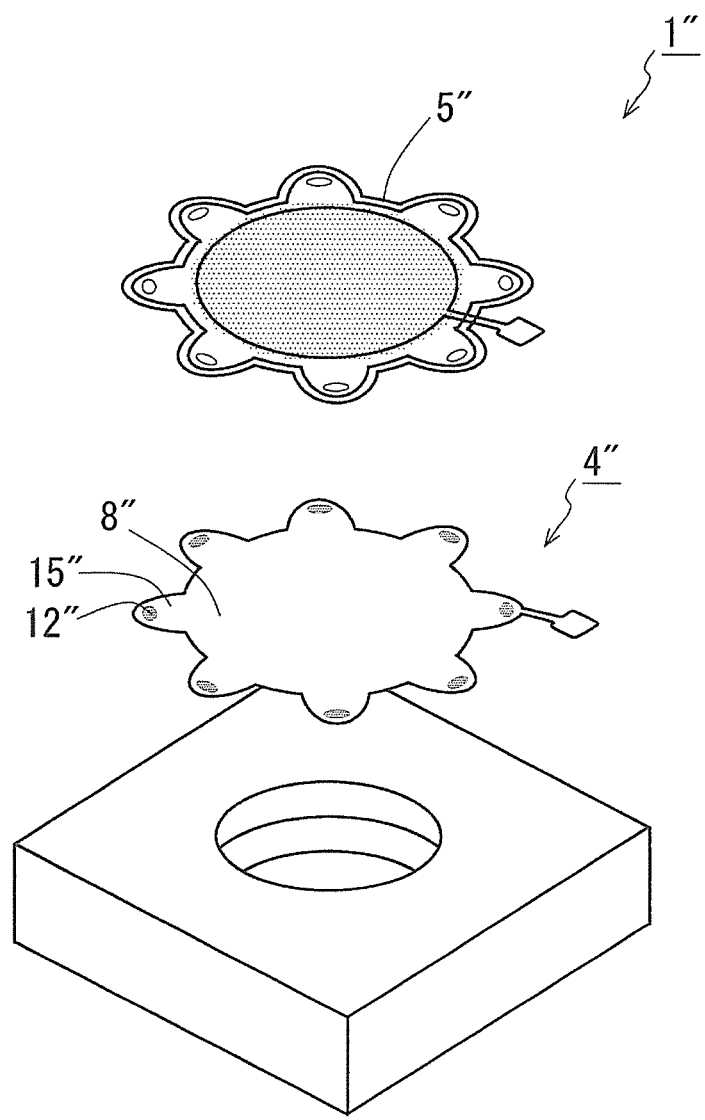
FIG. 10 is a diagram showing an acoustic sensor including a circular vibrating member.

Although the acoustic sensors 1 and 1' according to the above embodiments and modifications include the rectangular vibrating members 8a and 8b and 8', an acoustic sensor described in the present application may have another structure. FIG. 10 shows an acoustic sensor including a circular vibrating member. The acoustic sensors 1 and 1' according to the above embodiments and modifications may be modified to, for example, an acoustic sensor 1" including a vibrating electrode film 4" including a circular vibrating member 8" as shown in FIG. 10. This acoustic sensor including the circular vibrating member 8" improves the impact resistance of the vibrating electrode film 4" and a back plate 5" in the same manner as the acoustic sensors 1 and 1' according to the above embodiments and modifications when a fixing portion 12" arranged at a protruding end of each leg portion 15" protruding from an edge of the vibrating member 8" is fixed to the back plate 5", and the vibrating electrode film 4" is suspended from the back plate 5", and further the back plate 5" surrounds the fixing portions 12".

The advantages of the acoustic sensors 1, 1', and 1" according to the above embodiments and modifications have been tested. The results are described below.

Test 1

Figure 11:
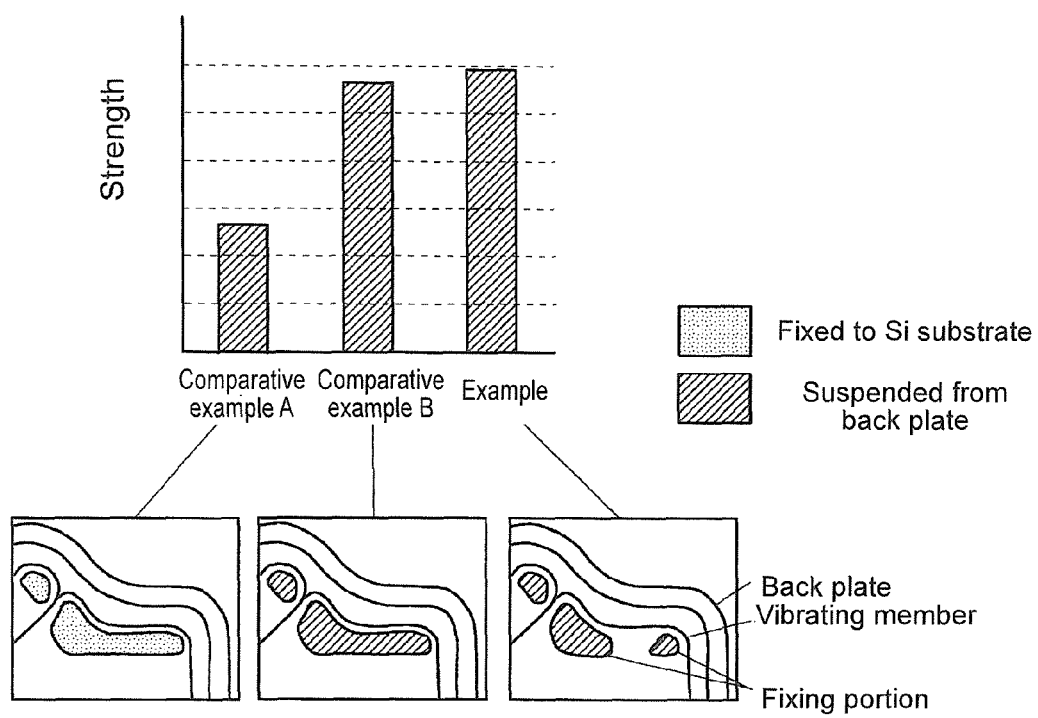
FIG. 11 is a graph showing the comparison results representing the relationship between the shape of fixing portions included in a vibrating member and the strength, and showing the sound pressure applied to the vibrating member to cause cracks in the vibrating member.

FIG. 11 is a graph showing the comparison results representing the relationship between the shape of fixing portions included in a vibrating member and the strength, and showing the sound pressure applied to the vibrating member to cause cracks in the vibrating member. Comparative example A in FIG. 11 indicates the strength of the structure including a vibrating electrode film fixed to a silicon substrate. Comparative example B in FIG. 11 indicates the strength of the structure including a vibrating electrode film suspended from a back plate. An example indicates the strength of the structure including a vibrating electrode film suspended from a back plate and including a set of fixing portions with a smaller area, in the same manner as the vibrating member 8b according to the above embodiments and modifications.

For example, a vibrating member with a relatively small area for mainly detecting a large sound, such as the vibrating member 8b, is more compact than a vibrating member with a large area, and thus has higher rigidity. A vibrating member with a smaller area and higher rigidity can crack easily. As the comparison between comparative examples A and B and the example in FIG. 11 shows, the structures of comparative example B and the example each including the vibrating member suspended from the back plate having lower rigidity than a silicon substrate can deform in accordance with the deformation of the back plate, and thus can have the impact resistance of about twice as high as the impact resistance of the structure of comparative example A including the vibrating member fixed to the silicon substrate with higher rigidity. Further, the structure of the example including the vibrating member suspended from the back plate includes a set of fixing portions with smaller areas. This structure can have the impact resistance slightly higher than the impact resistance of the structure of comparative example B including fixing portions that are not separated. The structure of the example has higher strength than the structure of comparative example B seemingly because separating the fixing portions reduces stress occurring in the fixing portions.

The invention claimed is:

1. An acoustic sensor, comprising:
  a semiconductor substrate;
  a back plate including a fixed plate arranged to face a surface of the semiconductor substrate, and a fixed electrode film arranged on the fixed plate; and
  a vibrating electrode film arranged to face the back plate with a space formed therebetween,
  the acoustic sensor being configured to convert acoustic vibration to a change in an electrostatic capacitance between the vibrating electrode film and the fixed electrode film and detect the acoustic vibration,
  wherein the vibrating electrode film includes a plate-like vibrating member configured to vibrate in response to sound pressure, and the vibrating electrode film is fixed to the back plate with a fixing unit thereof, and the fixing unit includes at least two fixing portions disposed on opposite sides of the vibrating electrode film, and each fixing portion having a fixing protruding end that is arranged on a protruding end of a leg portion protruding from an edge of the vibrating member, and
  the back plate has an edge portion surrounding at least a part of the fixing protruding end.

2. The acoustic sensor according to claim 1, wherein at least one of the fixing portions included in the fixing unit includes a reinforcing portion disposed on the back plate at a position thereof opposite to a position where the vibrating electrode film is fixed to the back plate.

3. The acoustic sensor according to claim 2, wherein at least one of the reinforcing portions is electrically connected to the vibrating electrode film, and is configured to serve as a terminal of the vibrating electrode film.

4. The acoustic sensor according to claim 3, wherein at least one of the fixing portions includes a set of separate fixing portions each having a smaller area.

5. The acoustic sensor according to claim 4, wherein
  the vibrating electrode film includes a plurality of separate areas as viewed from above, and includes a plurality of the vibrating members in correspondence with the plurality of separate areas, and
  at least one of the plurality of vibrating members has a smaller area than other vibrating members, and the at least one ofthe plurality of vibrating members having a smaller area than the other vibrating members is fixed to the back plate with at least one fixing portion arranged on an edge thereof.

6. The acoustic sensor according to claim 3, wherein
  the vibrating electrode film includes a plurality of separate areas as viewed from above, and includes a plurality of the vibrating members in correspondence with the plurality of separate areas, and
  at least one of the plurality of vibrating members has a smaller area than other vibrating members, and the at least one of the plurality ofvibrating members having a smaller area than the other vibrating members is fixed to the back plate with at least one fixing portion arranged on an edge thereof.

7. The acoustic sensor according to claim 2, wherein at least one of the fixing portions includes a set of separate fixing portions each having a smaller area.

8. The acoustic sensor according to claim 7, wherein
  the vibrating electrode film includes a plurality of separate areas as viewed from above, and includes a plurality of the vibrating members in correspondence with the plurality of separate areas, and
  at least one of the plurality of vibrating members has a smaller area than other vibrating members, and the at least one of the plurality of vibrating members having a smaller area than the other vibrating members is fixed to the back plate with at least one fixing portion arranged on an edge thereof.

9. The acoustic sensor according to claim 2, wherein
the vibrating electrode film includes a plurality of separate areas as viewed from above, and includes a plurality of the vibrating members in correspondence with the plurality of separate areas, and
at least one of the plurality of vibrating members has a smaller area than other vibrating members, and the at least one of the plurality of vibrating members having a smaller area than the other vibrating members is fixed to the back plate with at least one fixing portion arranged on an edge thereof.

10. The acoustic sensor according to claim 1, wherein each of all the fixing portions included in the fixing unit includes a reinforcing portion disposed on the back plate at a position thereof opposite to a position where the vibrating electrode film is fixed to the back plate.

11. The acoustic sensor according to claim 10, wherein at least one of the fixing portions includes a set of separate fixing portions each having a smaller area.

12. The acoustic sensor according to claim 11, wherein
the vibrating electrode film includes a plurality of separate areas as viewed from above, and includes a plurality of the vibrating members in correspondence with the plurality of separate areas, and
at least one of the plurality of vibrating members has a smaller area than other vibrating members, and the at least one of the plurality of vibrating members having a smaller area than the other vibrating members is fixed to the back plate with at least one fixing portion arranged on an edge thereof.

13. The acoustic sensor according to claim 10, wherein
the vibrating electrode film includes a plurality of separate areas as viewed from above, and includes a plurality of the vibrating members in correspondence with the plurality of separate areas, and
at least one of the plurality of vibrating members has a smaller area than other vibrating members, and the at least one ofthe plurality of vibrating members having a smaller area than the other vibrating members is fixed to the back plate with at least one fixing portion arranged on an edge thereof.

14. The acoustic sensor according to claim 1, wherein at least one of the fixing portions includes a set of separate fixing portions each having a smaller area.

15. The acoustic sensor according to claim 14, wherein
the vibrating electrode film includes a plurality of separate areas as viewed from above, and includes a plurality of the vibrating members in correspondence with the plurality of separate areas, and
at least one of the plurality of vibrating members has a smaller area than other vibrating members, and the at least one of the plurality of vibrating members having a smaller area than the other vibrating members is fixed to the back plate with at least one fixing portion arranged on an edge thereof.

16. The acoustic sensor according to claim 1, wherein
the vibrating electrode film includes a plurality of separate areas as viewed from above, and includes a plurality of the vibrating members in correspondence with the plurality of separate areas, and
at least one of the plurality of vibrating members has a smaller area than other vibrating members, and the at least one of the plurality of vibrating members having a smaller area than the other vibrating members is fixed to the back plate with at least one fixing portion arranged on an edge thereof.

17. An acoustic sensor, comprising:
a semiconductor substrate;
a back plate including a fixed plate arranged to face a surface of the semiconductor substrate, and a fixed electrode film arranged on the fixed plate; and
a vibrating electrode film arranged to face the back plate with a space formed therebetween,
wherein the vibrating electrode film includes a plurality of separate areas as viewed from above, and includes a plurality of vibrating members in correspondence with the plurality of separate areas, and the plurality of vibrating members are configured to convert acoustic vibration to a change in an electrostatic capacitance between the vibrating electrode film and the fixed electrode film and detect the acoustic vibration, and
at least one of the plurality of vibrating members has a smaller area than other vibrating members, and the at least one ofthe plurality of vibrating members having a smaller area than the other vibrating members is fixed to the back plate with at least one fixing portion arranged on an edge thereof.

* * * * *